(12) United States Patent
Wu et al.

(10) Patent No.: US 7,829,625 B2
(45) Date of Patent: Nov. 9, 2010

(54) PHASE-SEPARATED DIELECTRIC STRUCTURE FABRICATION PROCESS

(75) Inventors: Yiliang Wu, Oakville (CA); Hadi K. Mahabadi, Mississauga (CA); Beng S. Ong, 04-02 Park Oasis (SG); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/436,975

(22) Filed: May 7, 2009

(65) Prior Publication Data
US 2009/0234056 A1 Sep. 17, 2009

Related U.S. Application Data

(62) Division of application No. 11/695,131, filed on Apr. 2, 2007.

(51) Int. Cl.
C08L 83/00 (2006.01)
C08K 5/06 (2006.01)
(52) U.S. Cl. ............................. 524/506; 524/376
(58) Field of Classification Search ................. 524/506
See application file for complete search history.

(56) References Cited

U.S. PATENT DOCUMENTS

| | | | |
|---|---|---|---|
| 5,374,453 A | 12/1994 | Swei et al. | |
| 5,883,219 A | 3/1999 | Carter et al. | |
| 6,136,702 A | 10/2000 | Chandross et al. | |
| 6,280,794 B1 * | 8/2001 | Tu et al. | 427/99.2 |
| 6,528,409 B1 | 3/2003 | Lopatin et al. | |
| 6,706,464 B2 | 3/2004 | Foster et al. | |
| 6,809,371 B2 | 10/2004 | Sugiyama | |
| 6,888,249 B2 | 5/2005 | Kohl et al. | |
| 6,914,147 B2 | 7/2005 | Lee et al. | |
| 7,098,525 B2 | 8/2006 | Bai et al. | |
| 7,348,280 B2 | 3/2008 | Hsu et al. | |
| 7,482,286 B2 | 1/2009 | Misra et al. | |
| 2006/0214154 A1 * | 9/2006 | Yang et al. | 257/40 |
| 2006/0231908 A1 * | 10/2006 | Liu et al. | 257/410 |
| 2006/0234430 A1 | 10/2006 | Liu et al. | |
| 2008/0237581 A1 | 10/2008 | Wu et al. | |

OTHER PUBLICATIONS

K. Mohomed et al., Polymer "A broad spectrum analysis of the dielectric properties of Poly (2-hydroxyethyl methacrylate)" 46, p. 3847-3855 (2005).
J. Remenar, et al., Mat. Res. Soc. Proc. "Templating nanopores into poly(methylsilsesquioxane): new low-k dielectric coatings suitable for microelectronics applications" 511, p. 69-74 (1998).
V. Ginzburg, Macromolecules "High-dielectric constant self assembled nodular structures in polymer/gold nanoparticle films" 39, p. 3901-3906 (2006).
Facchetti et al., "Gate Dielectrics for Organic Field-Effect Transistors: New Opportunities for Organic Electronics", Adv. Mater., vol. 17, pp. 1705-1725 (2005).

* cited by examiner

*Primary Examiner*—Ling-Siu Choi
*Assistant Examiner*—Hui Chin
(74) *Attorney, Agent, or Firm*—Fay Sharpe LLP

(57) ABSTRACT

A process for fabricating an electronic device including: depositing a layer comprising a semiconductor; liquid depositing a dielectric composition comprising a lower-k dielectric material, a higher-k dielectric material, and a liquid, wherein the lower-k dielectric material and the higher-k dielectric material are not phase separated prior to the liquid depositing; and causing phase separation of the lower-k dielectric material and the higher-k dielectric material to form a phase-separated dielectric structure wherein the lower-k dielectric material is in a higher concentration than the higher-k dielectric material in a region of the dielectric structure closest to the layer comprising the semiconductor, wherein the depositing the layer comprising the semiconductor is prior to the liquid depositing the dielectric composition or subsequent to the causing phase separation.

19 Claims, 2 Drawing Sheets

PHASE-SEPARATED DIELECTRIC STRUCTURE FABRICATION PROCESS

CROSS-REFERENCE TO RELATED APPLICATIONS

This application is a divisional of U.S. patent application Ser. No. 11/695,131, filed Apr. 2, 2007, the disclosure of which is totally incorporated herein by reference.

Yiliang Wu et al., U.S. application Ser. No. 11/695,138, filed Apr. 2, 2007, titled DEVICE WITH PHASE-SEPARATED DIELECTRIC STRUCTURE, the disclosure of which is totally incorporated herein by reference.

Yiliang Wu et al., U.S. application Ser. No. 11/276,634, filed Mar. 8, 2006, titled TFT FABRICATION PROCESS.

Yiliang Wu et al., U.S. application Ser. No. 11/104,728, filed Apr. 13, 2005, titled MULTILAYER GATE DIELECTRIC.

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND

The present disclosure relates, in various representative embodiments, to electronic devices and materials suitable for use in such devices as well as fabrication processes for electronic devices and components thereof. More specifically, the present disclosure relates to electronic devices incorporating a phase-separated dielectric structure as well as fabrication processes for such electronic devices and phase-separated dielectric structures.

Thin film transistors (TFT) are fundamental components in modern-age electronics, including, for example, sensor, imaging, and display devices. Thin film transistor circuits using current mainstream silicon technology may be too costly, particularly for large-area devices (e.g., backplane switching circuits for displays like active matrix liquid crystal monitors or televisions) and low-end applications (e.g. Radio Frequency Identification (RFID) Tags), where high switching speeds are not essential. The high costs of silicon-based thin film transistor circuits are primarily due to the capital-intensive fabrication facilities and the complex high-temperature, high-vacuum photolithographic fabrication processes under strictly controlled environments.

Because of the cost and complexity of fabricating silicon-based thin film transistor circuits using conventional photolithography processes, there has been an increased interest in plastic/organic thin film transistors which can potentially be fabricated using liquid-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To fabricate liquid-processed thin film transistor circuits, liquid processable materials are therefore required.

Most of the current materials research and development activities for plastic thin film transistors have been devoted to semiconductor materials, particularly liquid-processable organic and polymer semiconductors. On the other hand, other material components such as dielectric materials have not been receiving much attention.

In embodiments, it is desirable for the materials for the dielectric to have a number of attributes including for example the following: (1) a good electrical insulating property; and (2) a good compatibility with the semiconductor materials. An issue with conventional gate dielectrics is that it may be difficult to accommodate all the desired attributes for the dielectric materials via a simple process. Accommodating the desired attributes (1) and (2) is accomplished by embodiments of the present invention.

The following documents provide background information:

Lopatin et al., U.S. Pat. No. 6,528,409.
Foster et al., U.S. Pat. No. 6,706,464.
Carter et al., U.S. Pat. No. 5,883,219.
Bai et al., U.S. Pat. No. 7,098,525 B2.
Sugiyama, U.S. Pat. No. 6,809,371 B2.
Antonio Facchetti et al., "Gate Dielectrics for Organic Field-Effect Transistors: New Opportunities for Organic Electronics," Adv. Mater., Vol. 17, pp. 1705-1725 (2005).

SUMMARY OF THE DISCLOSURE

There is provided in embodiments a process for fabricating an electronic device comprising:
  depositing a layer comprising a semiconductor;
  liquid depositing a dielectric composition comprising a lower-k dielectric material, a higher-k dielectric material, and a liquid, wherein the lower-k dielectric material and the higher-k dielectric material are not phase separated prior to the liquid depositing; and
  causing phase separation of the lower-k dielectric material and the higher-k dielectric material to form a phase-separated dielectric structure wherein the lower-k dielectric material is in a higher concentration than the higher-k dielectric material in a region of the dielectric structure closest to the layer comprising the semiconductor
  wherein the depositing the layer comprising the semiconductor is prior to the liquid depositing the dielectric composition or subsequent to the causing phase separation.

In further embodiments, there is provided a process for fabricating an electronic device comprising:
  depositing a layer comprising a semiconductor;
  liquid depositing in a single step a dielectric composition comprising a lower-k dielectric material, a higher-k dielectric material, and a liquid, wherein the lower-k dielectric material and the higher-k dielectric material are not phase separated prior to the liquid depositing; and
  causing phase separation of the lower-k dielectric material and the higher-k dielectric material to form a phase-separated dielectric structure wherein the lower-k dielectric material is at a concentration ranging from about 60% to 100% and the higher-k dielectric material is at a concentration ranging from about 40% to 0% of the total weight of the lower-k and the higher-k dielectric materials in a region of the dielectric structure closest to the layer comprising the semiconductor
  wherein the depositing the layer comprising the semiconductor is prior to the liquid depositing the dielectric composition or subsequent to the causing phase separation.

In additional embodiments, there is provided a process for fabricating a thin film transistor comprising:

depositing a layer comprising a semiconductor;

liquid depositing a dielectric composition comprising a lower-k dielectric material, a higher-k dielectric material, and a liquid, wherein the lower-k dielectric material and the higher-k dielectric material are dissolved in the liquid; and causing phase separation of the lower-k dielectric material and the higher-k dielectric material to form a phase-separated gate dielectric comprising a lower-k dielectric material-majority/higher-k dielectric material-minority first phase and a higher-k dielectric material-majority/lower-k dielectric material-minority second phase, wherein the lower-k dielectric material is in a higher concentration than the higher-k dielectric material in a region of the dielectric structure closest to the layer comprising the semiconductor wherein the depositing the layer comprising the semiconductor is prior to the liquid depositing the dielectric composition or subsequent to the causing phase separation.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
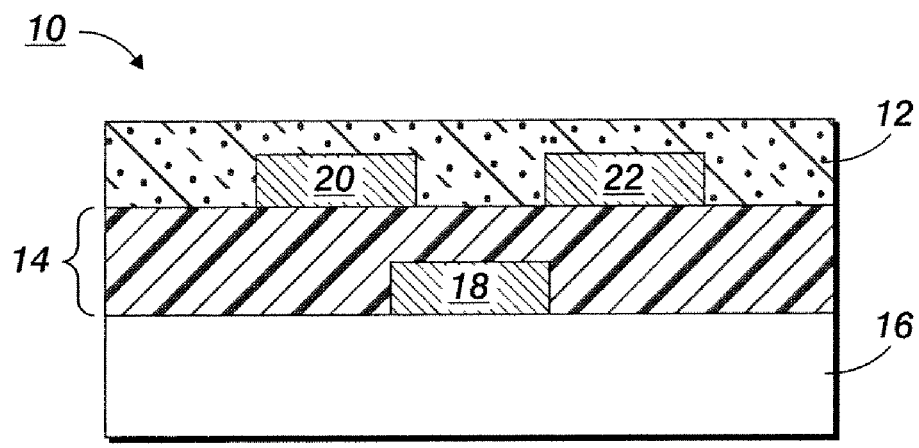
FIG. 1 represents a first embodiment of the present invention in the form of a TFT.

Aspects of the present disclosure relate to an electronic device (e.g., a thin film transistor) comprising a phase-separated dielectric structure. In the context of a thin film transistor, the phase-separated dielectric structure also can be referred to as a "gate dielectric." The phase-separated dielectric structure can be used in any suitable electronic device. Besides a thin film transistor, other types of suitable electronic devices include for example an embedded capacitor and an electroluminescent lamp.

In fabricating the present dielectric structure, a dielectric composition is prepared comprising a lower-k dielectric material, a higher-k dielectric material, and a liquid, wherein the lower-k dielectric material and the higher-k dielectric material are not phase separated prior to the liquid depositing.

In embodiments, the terms "lower-k dielectric material" and "higher-k dielectric material" are used to differentiate two types of dielectric materials (based on the dielectric constant) in the dielectric composition and in the phase-separated dielectric structure. Therefore, any suitable dielectric material can be the lower-k dielectric material, and any suitable dielectric material which has a higher dielectric constant than the lower-k dielectric material can be the higher-k dielectric material. The "lower-k dielectric material" can comprise one, two, or more suitable materials. The "higher-k dielectric material" can comprise one, two, or more suitable materials.

In embodiments, the lower-k dielectric material is an electrically insulating material which is compatible or has good compatibility with a semiconductor layer in the device. The term "compatible" (or "compatibility") refers to how well the semiconductor layer can perform electrically when it is adjacent to a surface rich in the lower-k dielectric material. For example, a hydrophobic surface is generally preferred for polythiophene semiconductors. In embodiments, the lower-k dielectric material has a hydrophobic surface and therefore may exhibit satisfactory to excellent compatibility with polythiophene semiconductors.

In embodiments, the lower-k dielectric material has a dielectric constant (permittivity) of for instance less than 4.0, or less than about 3.5, or particularly less than about 3.0. In embodiments, the lower-k dielectric material has non-polar or weak polar groups such as methyl group, phenylene group, ethylene group, Si—C, Si—O—Si, and the like. In embodiments, the lower-k dielectric material is a lower-k dielectric polymer. Representative lower-k dielectric polymer includes but is not limited to polystyrene, poly(4-methylstyrene), poly(chlorostyrene), poly(α-methylstyrene), polysiloxane such as poly(dimethyl siloxane) and poly(diphenyl siloxane), polysilsesquioxane such as poly(ethylsilsesquioxane), poly(methyl silsesquioxane), and poly(phenyl silsesquioxane), polyphenylene, poly(1,3-butadiene), poly(α-vinylnaphthalene), polypropylene, polyisoprene, polyisobutylene, polyethylene, poly(4-methyl-1-pentene), poly(p-xylene), poly(cyclohexyl methacrylate), poly (propylmethacrylPOSS-co-methylmethacrylate), poly(propylmethacrylPOSS-co-styrene), poly(styrylPOSS-co-styrene), poly(vinyl cinnamate), and the like. In embodiments, the lower-k dielectric material comprises a polysilsesquioxane, particularly poly(methyl silsisquioxane). The dielectric constant is of the materials at room temperature measured at 1 kHz frequency.

In embodiments, the surface of lower-k dielectric material, when cast as a film, has a low surface energy. To characterize the surface energy, advancing water contact angle can be used. A high contact angle indicates a low surface energy. In embodiments, the contact angle is 80 degrees or higher, or higher than about 90 degrees, or particularly higher than about 95 degrees.

In embodiments, the higher-k dielectric material is an electrically insulating material containing for instance polar groups such as hydroxyl group, amino group, cyano group, nitro group, C=O group, and the like. In embodiments, the higher-k dielectric material has a dielectric constant of 4.0 or more, or more than about 5.0, or particularly more than about 6.0. In embodiments, the higher-k dielectric material is a higher-k dielectric polymer. Any suitable higher-k dielectric polymer such as polyimide, polyester, polyether, polyacrylate, polyvinyl, polyketone, and polysulfone can be used. Representative higher-k dielectric polymer includes but is not limited to poly(4-vinyl phenol) (PVP), poly(vinyl alcohol), and poly(2-hydroxylethyl methacrylate) (PHEMA), cyanoethylated poly(vinyl alcohol), cyanoethylated cellulose, poly(vinylidene fluoride) (PVDF), poly(vinyl pyridine), copolymer thereof, and the like. In embodiments, the higher-k dielectric material is PVP and/or PHEMA.

In embodiments, the higher-k dielectric material, when cast as a film, has a high surface energy. In terms of advancing water contact angle, the angle is for instance lower than 80 degrees, or lower than about 60 degrees, or lower than about 50 degrees.

In embodiments, the difference in magnitude of the dielectric constant of the higher-k dielectric material versus the lower-k dielectric material is at least about 0.5, or at least about 1.0, or at least about 2.0, for example from about 0.5 to about 200.

In embodiments, the present phase-separated dielectric structure contains intentionally created pores (also referred to as voids and apertures) such as those created using processes and materials similar to those described in for example Lopatin et al., U.S. Pat. No. 6,528,409; Foster et al., U.S. Pat. No. 6,706,464; and Carter et al., U.S. Pat. No. 5,883,219. In other embodiments, the present phase-separated dielectric structure does not contain such intentionally created pores (but pinholes may be present in certain embodiments which are not intentionally created but rather are an undesired byproduct of the present process). The pinhole density in embodiments is for example less than 50 per $mm^2$ (square millimeter), or less than 10 per $mm^2$, or less than 5 $mm^2$. In further embodiments, the present phase-separated dielectric structure is pinhole free. In embodiments, the dielectric composition is non-photoimageable. In embodiments, there is absent a step to create pores in the dielectric structure.

In embodiments, the dielectric structure has an overall dielectric constant of more than about 4.0, or more than about 5.0, particularly more than about 6.0. The overall dielectric constant can be characterized with a metal/dielectric structure/metal capacitor. Particularly for thin film transistor application, a high overall dielectric constant is desirable in embodiments, so that the device can be operated at a relatively low voltage.

One, two or more suitable fluids can be used for the liquid (which facilitates the liquid depositing). In embodiments, the liquid is capable of dissolving the lower-k dielectric material and the higher-k dielectric material. Representative liquid includes but is not limited to water, alcohol such as methanol, ethanol, propanol, butanol, and methoxyethanol, acetate such as ethyl acetate and propylene glycol monoethyl ether acetate, ketone such as methyl isobutyl ketone, methyl isoamyl ketone, acetone, methyl ethyl ketone, and methyl propyl ketone, ether such as petroleum ether, tetrahydrofuran, and methyl t-butyl ether, hydrocarbon such as hexane, cyclohexane, cyclopentane, hexadecane, iso-octane, aromatic hydrocarbon such as toluene, xylene, ethyl benzene, and mesitylene, chlorinated solvent such as chloroform, dichloromethane, dichloroethane, chlorobenzene, dichlorobenzene, and trichlorobenzene, and other solvent such as dimethyl sulfoxide, trifluoroacetic acid, acetonitrile, dimethyl formamide, dimethyl acetamide, pyridine, n-methyl-alpha-pyrrolidinone.

Other materials can be added into the dielectric composition. Representative materials include a crosslinking agent for the lower-k dielectric material and/or for the higher-k dielectric material such as for example poly(melamine-co-formaldehyde). A catalyst for crosslinking may also be included such as for example toluenesulfonic acid. Inorganic nanoparticles used to boost the dielectric constant may be included such as for example $Al_2O_3$, $TiO_2$.

The concentration of each of the above listed components in the dielectric composition varies from about 0.001 to about 99 percent by weight. The concentration of the lower-k dielectric material is for example from about 0.1 to about 30 percent by weight, or from about 1 to about 20 percent by weight. The concentration of the higher-k dielectric material is for example from about 0.1 to about 50 percent by weight, or from about 5 to about 30 percent by weight. The concentration of crosslinking agent and catalyst for crosslinking reaction will depend on the concentration of the dielectric materials. The ratio of the crosslinking agent to the dielectric materials is for example from about 1:99 to about 50:50, or from about 5:95 to about 30:70 by weight. The ratio of the catalyst to the dielectric materials is for example from about 1:9999 to about 5:95, or from 1:999 to about 1:99 by weight. The inorganic nanoparticle can be for example from about 0.5 to about 30 percent by weight, or from about 1 to about 10 percent by weight.

In embodiments, the lower-k dielectric material and the higher-k dielectric material are not phase separated in the dielectric composition. In embodiments, the phrase "not phase separated" means for example that the lower-k dielectric material and the higher-k dielectric material are dissolved in the liquid. In embodiments, "dissolved" indicates total dissolution or partial dissolution of the lower-k dielectric material and the higher-k dielectric material in the liquid. In embodiments, the phrase "not phase separated" means for example that the lower-k dielectric material, the higher-k dielectric material and the liquid are miscible to form a single phase over certain ranges of temperature, pressure, and composition. The temperature range is for example from 0 to 150 degrees C., particularly at about room temperature. The pressure is for example about 1 atmosphere. In the dielectric composition prior to the liquid depositing, the lower-k dielectric material and the higher-k dielectric material can be present for example from about 0.1 to about 90 weight percent, or from about 0.5 to about 50 weight percent, based on the total weight of the lower-k dielectric material, the higher-k dielectric material and the liquid. The ratio between the lower-k dielectric material to the higher-k dielectric material can be for example from about 1:99 to 99:1, or from about 5:95 to about 95:5, particularly from about 10:90 to about 40:60 (first recited value in each ratio represents the lower-k dielectric material).

In embodiments where the lower-k dielectric material, the higher-k dielectric material and the liquid are miscible to form a single phase (typically a clear solution) prior to the liquid depositing, the single phase can be confirmed by light scattering technique, or visually detected by human eyes without the assistance of any tools.

Prior to the liquid depositing, the dielectric composition may contain in embodiments aggregates of the lower-k dielectric material and/or higher-k dielectric material. These aggregates may be for example on a scale less than the wavelength of visible light, or less than 100 nm, particularly less than 50 nm. For purposes of the present invention, these aggregates, if present in the dielectric composition, are not considered the result of phase separation or phase-separated; moreover, these aggregates are not considered the "first phase" and/or the "second phase."

The dielectric composition is liquid deposited onto a substrate. Any suitable liquid depositing technique may be employed. In embodiments, the liquid depositing includes blanket coating such as spin coating, blade coating, rod coating, dip coating, and the like, and printing such as screen printing, ink jet printing, stamping, stencil printing, screen printing, gravure printing, flexography printing, and the like.

In embodiments, the liquid depositing can be accomplished in a single step. The term "single step" refers to liquid depositing both the first and the second dielectric materials at the same time from one dielectric composition. This is different from the process for fabricating conventional dual-layer dielectric structure, wherein two different dielectric materials are liquid deposited separately from two different dielectric compositions. "Step" in "single step" is different from the term "pass". In embodiments, in order to increase thickness of the dielectric structure, more than 1 pass can be carried out during the single step deposition of the dielectric composition.

In fabricating the dielectric structure, the present process involves causing phase separation of the lower-k dielectric material and the higher-k dielectric material to form a dielectric structure comprising in embodiments a lower-k dielectric material-majority/higher-k dielectric material-minority first phase and a higher-k dielectric material-majority/lower-k dielectric material-minority second phase. The term "causing" includes spontaneous occurrence of phase separation during liquid deposition when the liquid evaporates. The term "causing" also includes external assistance for facilitating the phase separation during and after the liquid deposition; in embodiments, phase separation is caused by for example thermal annealing and/or solvent annealing. Thermal annealing could be performed at any suitable temperature, for example at a temperature higher than the glass transition temperature or melting point of one of the dielectric material. The thermal annealing time, depending on particular dielectric combination, could be for example from about 1 min to about 1 day, or from about 1 min to 1 hour. Solvent annealing can be done at any temperature such as room temperature or an elevated temperature by exposing the deposited dielectric structure to vapor of one or more solvents. Representative solvents can be selected for instance from the liquids described herein for the liquid depositing. The solvent annealing time, depending on particular dielectric combination, could be for example from about a few seconds to about 1 week, or from about 1 min to 2 hours.

In embodiments, the term "phase" in "first phase" and "second phase" means a domain or domains of material in which a property such as chemical composition is relatively uniform. Accordingly, the term "interphase" refers to an area between the first phase and the second phase in the phase-separated dielectric structure in which a gradient in composition exists. In embodiments, the dielectric structure comprises the sequence: the first phase, optional interphase, and the second phase.

In embodiments, the "phase-separated" nature of the present phase-separated dielectric structure is manifested by any of the following possible representative morphologies of the first phase and the second phase: (1) an interphase (in the form of a layer) present between the first phase (in the form of a layer) and the second phase (in the form of a layer); (2) one phase forms a plurality of "dots" in a continuous matrix of the other phase; (3) one phase forms a plurality of rod-shaped elements (e.g. cylinders) in a continuous matrix of the other phase; and (4) one phase is interpenetrating into the other phase to form bicontinuous domains. In embodiments, morphology (2), (3), or (4) may be present, but not (1).

The "phase-separated" nature of the present phase-separated dielectric structure regarding the morphology of the first phase and the second phase can be determined by various analyses such as for example the following: Scanning Electron Microscopy (SEM) and Atomic Force Microscopy (AFM) analysis of surface and cross-section of the dielectric structure; and Transmission Electron Microscopy (TEM) analysis of a cross-section of the dielectric structure. Other tools such as light scattering and X-ray (wide angle and small angle X-rays) scattering could also be used.

In embodiments, morphology (1) involving the interphase differs from a conventional dual-layer gate dielectric having an interfacial layer in that the interphase involves a gradient composition change; whereas the interfacial layer involves a discontinuous composition change, not a gradient composition change. In embodiments, another difference is that the present interphase is relatively thick, involving a thickness ranging from about 10 nm to about 50 nm, which typically is significantly larger than any interfacial layer found in a conventional dual-layer gate dielectric which may have a interfacial layer thickness of less than about 5 nm, particularly less than about 3 nm.

In embodiments, the first phase comprises the lower-k dielectric material in the majority and the higher-k dielectric material in the minority. The second phase comprises the lower-k dielectric material in the minority and the higher-k dielectric material in the majority. The term "majority" means more than 50% by weight of the total weight of the lower-k dielectric material and the higher-k dielectric material in a phase of the phase-separated dielectric structure. In embodiments, the term "majority" indicates 51 to 100% by weight, about 55 to about 95% by weight, or about 80 to 100% by weight in a phase of the phase-separated dielectric structure.

The term "minority" means less than 50% by weight of the total weight of the lower-k dielectric material and the higher-k dielectric material in a phase of the phase-separated dielectric structure. In embodiments, the term "minority" indicates 49 to 0% by weight, about 45 to about 5% by weight, or about 20 to 0% by weight in a phase of the phase-separated dielectric structure.

In embodiments, the lower-k dielectric material is in a higher concentration than the higher-k dielectric material in a region of the dielectric structure closest to the layer comprising the semiconductor.

The term "region" refers to a thin slice (parallel to the surface of the dielectric structure) of the phase-separated dielectric structure closest to the semiconductor layer. The region is examined to determine its concentration of the lower-k dielectric material and the higher-k dielectric material. In embodiments, the region contains a portion of or all of the first phase and optionally a portion of or all of the second phase. In embodiments, the optional interfacial layer may be present in the phase-separated dielectric structure and thus the region may include the interfacial layer as long as the region has a sufficient thickness to include a portion or all of the first phase and optionally a portion or all of the second phase. The region has any suitable thickness for use in an analytical technique such as for example from about 1 nm to about 100 nm, or from about 5 nm to about 100 nm, or particularly from about 5 nm to about 50 nm. Various methods can be used to determine the concentration of the first dielectric material and the second dielectric material. For example, X-Ray Photoelectron Spectroscopy (XPS) can be used to analyze the concentration of each atom of different dielectric materials in the region. AFM could be used to determine domain size of different phases. TEM on cross-section of the region could also be used to determine domain size of difference phases and concentration of each atom of different dielectric materials. In certain embodiments, the combination of different methods may be used. In case of significant variation in results from different methods, the results from TEM analysis is preferred.

In embodiments of the "region," the lower-k dielectric material is at a concentration for example ranging from about 60% to 100%, or from about 80% to 100%, and the higher-k dielectric material is at a concentration ranging from about 40% to 0%, or from about 20% to 0%. The concentration can be controlled by various factors such as the initial ratio of the lower-k dielectric material and the higher-k dielectric material in the dielectric composition, the concentration of the dielectric materials in the dielectric composition, the miscibility of the dielectric materials, the processing conditions such as the annealing time and annealing temperature.

In order to achieve phase separation, in embodiments, the lower-k dielectric material and higher-k dielectric material are intentionally chosen to be immiscible or partial miscible in solid state. The miscibility (capability of a mixture to form a single phase) of two dielectric materials such as two polymers can be predicted by looking at their interaction parameter, $\chi$. Generally speaking, a polymer is miscible with another polymer which is similar to it.

In embodiments where the phase-separated dielectric structure is layered (morphology (1)), the first phase has a thickness for example from about 1 nm to about 500 nm, or from about 5 nm to about 200 nm, or from about 5 nm to about 50 nm. The second phase has a thickness for example from about 5 nm to about 2 micrometer, or from about 10 nm to about 500 nm, or from about 100 nm to about 500 nm. The dielectric structure has an overall thickness for example from about 10 nm to about 2 micrometers, or from about 200 nm to about 1 micrometer, or from about 300 to about 800 nm.

In embodiments, the lower-k dielectric material in the phase-separated dielectric structure is crosslinked. In embodiments, the lower-k dielectric material in the phase-separated dielectric structure is self-crosslinked. In embodiments, the lower-k dielectric material in the phase-separated dielectric structure is thermally self-crosslinked. In embodiments, both the lower-k dielectric material and the higher-k dielectric material in the phase-separated dielectric structure are crosslinked.

In embodiments, the phase-separated dielectric structure comprises a polymer blend where for example the lower-k dielectric material is a polymer and the higher-k dielectric material is a different polymer. In embodiments, the phase-separated polymer blend is a binary blend. In other embodiments, the phase-separated polymer blend is a ternary blend or a quaternary blend when a third or a fourth dielectric material is added respectively. As used herein, the term "blend" merely indicates the presence of two or more materials and does not imply the concentration or distribution of the lower-k dielectric material and the high-k dielectric material in the first phase and the second phase. Further aspects of the present disclosure relate to a thin film transistor comprising a phase-separated, polymer blend gate dielectric.

Optional interfacial layer could be present between the semiconductor layer and the phase-separated dielectric structure. The interfacial layer may be prepared using the materials and procedures disclosed in for example Yiliang Wu et al., U.S. application Ser. No. 11/276,694, filed Mar. 10, 2006, the disclosure of which is totally incorporated herein by reference.

The present invention has several advantages. First, the process in embodiments can avoid multiple-step deposition of different dielectric materials by using the optional single step feature. Second, in embodiments, the phase-separated polymer blend dielectric may offer better properties via the combination of advantages of different polymers.

In FIG. 1, there is schematically illustrated an organic thin film transistor ("OTFT") configuration 10 comprised of a substrate 16, in contact therewith a metal contact 18 (gate electrode) and a phase-separated gate dielectric 14 on top of which two metal contacts, source electrode 20 and drain electrode 22, are deposited. Over and between the metal contacts 20 and 22 is an organic semiconductor layer 12 as illustrated herein.

Figure 2:
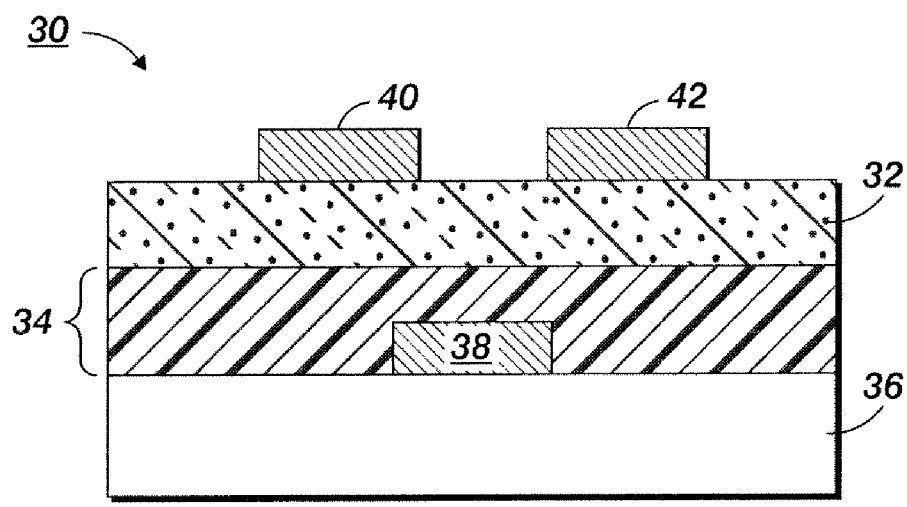
FIG. 2 represents a second embodiment of the present invention in the form of a TFT.

FIG. 2 schematically illustrates another OTFT configuration 30 comprised of a substrate 36, a gate electrode 38, a source electrode 40 and a drain electrode 42, a phase-separated gate dielectric 34, and an organic semiconductor layer 32.

Figure 3:
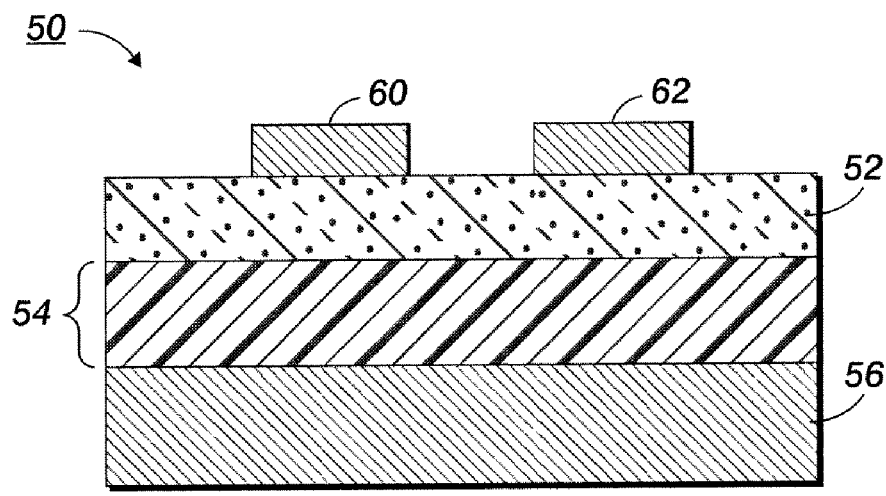
FIG. 3 represents a third embodiment of the present invention in the form of a TFT.

FIG. 3 schematically illustrates a further OTFT configuration 50 comprised of a heavily n-doped silicon wafer 56 which acts as both a substrate and a gate electrode, a phase-separated gate dielectric 54, and an organic semiconductor layer 52, on top of which are deposited a source electrode 60 and a drain electrode 62.

Figure 4:
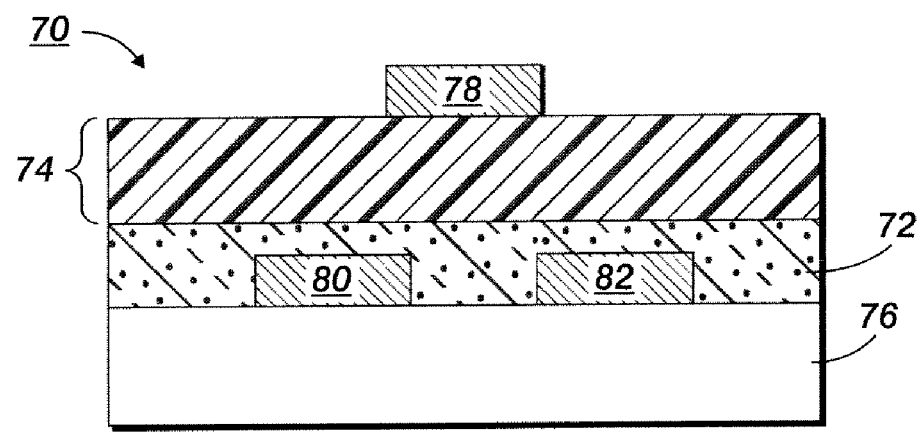
FIG. 4 represents a fourth embodiment of the present invention in the form of a TFT.

FIG. 4 schematically illustrates an additional OTFT configuration 70 comprised of substrate 76, a gate electrode 78, a source electrode 80, a drain electrode 82, an organic semiconductor layer 72, and a phase-separated gate dielectric 74.

Substrate

The substrate may be composed of for instance silicon, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor Layer

Materials suitable for use as the organic semiconductor layer include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, micro-contact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The composition and formation of the gate dielectric are described herein. In embodiments, the first phase and the second phase of the gate dielectric contact each other; in other embodiments, an interphase is present between the first phase and the second phase. In embodiments, the first phase of the gate dielectric contacts the semiconductor layer; in other embodiments, an interfacial layer is present between the first phase and the semiconductor layer. In embodiments, both the first phase and the second phase of the gate dielectric contact the semiconductor layer. In other embodiments, both the first phase and the second phase of the gate dielectric contact the semiconductor layer, wherein the contact area between the semiconductor layer and the first phase is larger than that between the semiconductor layer and the second phase in channel region (the region between the source and drain electrodes) of the thin film transistor.

The gate dielectric, the gate electrode, the semiconductor layer, the source electrode, and the drain electrode are formed in any sequence. In embodiments, the gate electrode and the semiconductor layer are both in contact with the gate dielectric, and the source electrode and the drain electrode are both in contact with the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature ranging for example from about 20 to about 25 degrees C.

COMPARATIVE EXAMPLE 1

In this comparative example, homogeneous gate dielectric was prepared as follows. 0.08 g poly(4-vinyl phenol) (PVP) (Aldrich, Mw=~20,000) was dissolved in 0.9 g n-butanol. 0.08 g poly(melamine-co-formaldehyde) (Aldrich, methylated 84 wt % in n-butanol, Mn=432) was added as the crosslinking agent. The dielectric composition was first filtered with 0.2 micron syringe filter and then spin coated at 2000 rpm onto an Al coated PET substrate, wherein the Al layer functions as the gate electrode for OTFTs. After dried at 80° C. for 10 min, the dielectric layer was thermally crosslinked at 160° C. for 30 min.

Surface of the dielectric structure was characterized by measurement of advancing water contact angle, which was 72° at time zero, but decreased slowly to 65° in 10 second. The low and unstable water contact angle indicated a hydrophilic surface. A poly(3,3'''-didodecyl-quaterthiophene) (PQT-12) semiconductor layer (PQT-12 is disclosed in Beng S. Ong, et. al. J. Am. Chem. Soc. 2004, 126, 3378-3379, the disclosure of which is totally incorporated herein by reference) was deposited on top of the dielectric by spin coating PQT-12 dispersion in 1,2-dichlorobenzene, followed by drying at 80° C. and annealing at 140° C. in vacuum oven. OTFTs were completed by vacuum evaporation gold source and drain electrodes on top of the semiconductor layer. The devices were characterized with Keithley 4200 SCS under ambient conditions. Mobility about 0.002-0.003 $cm^2/V.s$ and on/off ratio about $10^4$ were obtained.

EXAMPLE 1

In this example, phase-separated dielectric structure was prepared as follows. Poly(methyl silsesquioxane) (PMSSQ) was used as the lower-k dielectric material which provides good compatibility with polythiophene semiconductor, poly (4-vinyl phenol) (PVP) was used as the higher-k dielectric material, and n-butanol was used as the liquid. PMSSQ was prepared using methyltrimethoxysilane as precursor according to the following procedure. A mixture of 0.88 grams of aq. 0.1 wt % hydrochloric acid solution and 5.13 grams of tetrahydrofuran was added dropwise to a mixture of 4.08 grams of methyltrimethoxysilane and 9.24 grams of methylisobutylketone in a 3-necked flask cooled with an ice bath over a period of 30 minutes with rigorous stirring under a dry atmosphere. The resulting mixture was allowed to warm to room temperature and held there for 5 minutes before being heated to 60° C. and held there for 24 hours. Poly(melamine-co-formaldehyde), was added as the crosslinking agent for the higher-k dielectric materials PVP. A dielectric composition was formulated using the amount of materials shown in the following table.

| Materials | amount |
|---|---|
| Liquid, n-butanol | 0.9 g |
| Higher-k dielectric material, PVP | 0.077 g |
| Lower-k dielectric material, PMSSQ (25 wt % in n-butanol) | 0.116 g |
| Crosslinking agent for higher-k dielectric material, poly(melamine-co-formaldehyde) (methylated, 84 wt % in n-butanol) | 0.08 g |

The dielectric composition was first filtered with 0.2 micron syringe filter and then spin coated at 2000 rpm onto an Al coated PET substrate, wherein the Al layer functions as the gate electrode for OTFTs. After dried at 80° C. for 10 min, the dielectric layer was thermally annealed and crosslinked at 160° C. for 30 min. Water contact angle measurement showed an advancing contact angle of 100.9° at time zero, and the contact angle is stable over time (100.6° at 10 seconds). These indicated very hydrophobic and stable surface properties. The very hydrophobic characteristic revealed that the PMSSQ component migrated to the surface of the dielectric layer to form a phase-separated dielectric structure during spin coating and thermal crosslinking.

Phase separation was further confirmed by XPS measurement of the dielectric structure. Surface quantitative XPS analyses showed atom percentage as the follows: Si, 27.8%; O, 38.7%; C, 33.4%. No strong evidence of aromatic carbon atom in PVP on the surface in a significant amount. High atom percentage of Si, which is only present in the lower-k dielectric material PMSSQ, is at the surface region (a few nanometers). The N atom which is only in the crosslinking agent for the higher-k dielectric material was absent from the surface. All above indicated a phase-separated structure with PMSSQ majority phase at top of the dielectric structure and crosslinked PVP majority phase at bottom of the dielectric structure.

The depth profile XPS study of the phase-separated dielectric structure revealed that PMSSQ segregates to the topmost 40 nm of the surface. High concentration of O atom and Si atom, which are from the first dielectric material PMSSQ, was found in the topmost 40 nm region. The concentration of N atom start level off from the 40 nm away from the top surface.

OTFTs were completed by spin coating PQT-12 semiconductor and vacuum evaporation gold source drain electrodes as described in the Comparative Example 1. The device showed very low leakage current with turn-on voltage around zero. Mobility was calculated to be 0.1 $cm^2/V.s$ and on/off ratio about 10.sup.5.

COMPARATIVE EXAMPLE 2

In this comparative example, poly(2-hydroxylethyl, methacrylate) (Scientific Polymer Products, Inc.; Mw=1,000,000) was used as dielectric material, and Dowanol was used as the liquid to form the homogenous dielectric structure. The dielectric composition was formulated similar to Comparative Example 1 except that a 0.0008 g p-toluenesulfonic acid was added as catalyst for crosslinking. OTFT devices with this dielectric structure showed mobility 0.002-0.0043 $cm^2/V.s$ and current on/off ratio about $10^4$.

EXAMPLE 2

In this example, poly(2-hydroxylethyl, methacrylate) was used as the higher-k dielectric material and Dowanol was used as the liquid to replace the PVP and n-butanol in example 1. The dielectric composition was formulated similar to Example 1 except that a 0.0008 g p-toluenesulfonic acid was added as catalyst for crosslinking. OTFT devices with this dielectric structure showed mobility 0.05-0.06 $cm^2/V.s$ and current on/off ratio about $10^4$.

COMPARATIVE EXAMPLE 3

In this comparative Example, homogeneous gate dielectric is prepared from PMSSQ in n-butanol solution. The dielectric composition was first filtered with 0.2 micron syringe filter and then spin coated at 2000 rpm onto an Al coated PET substrate, wherein the Al layer functions as the gate electrode for OTFTs. After dried at 80° C. for 10 min, the dielectric layer was thermally crosslinked at 160° C. for 30 min. OTFT devices with this dielectric structure showed very low device yield (<10%) due to the leakage of the dielectric layer. Functional device showed mobility 0.06 cm2/V.s and a current on/off ratio 100-1000.

From above Examples and Comparative Examples one can see that device with either the first dielectric material or the second dielectric material only showed poor device performance. The device with the first dielectric material only had very low yield and very low current on/off ratio, while the device with the second dielectric material only had very low mobility. On the other hand, the device with the phase-separated first dielectric material and the second dielectric material blends showed both high mobility and high current on/off ratio.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A dielectric composition for fabricating a phase separated dielectric structure by liquid deposition, comprising a lower-k dielectric material, a higher-k dielectric material, and a liquid, wherein the lower-k dielectric material and the higher-k dielectric material are capable of phase separation subsequent to liquid deposition;
wherein the higher-k dielectric material has a dielectric constant of 4.0 or higher.

2. The dielectric composition of claim 1, wherein the lower-k dielectric material and the higher-k dielectric material are dissolved in the liquid and form a single phase prior to liquid deposition.

3. The dielectric composition of claim 1, wherein the lower-k dielectric material has a hydrophobic surface subsequent to liquid deposition.

4. The dielectric composition of claim 1, wherein the lower-k dielectric material has a dielectric constants of less than 4.0.

5. The dielectric composition of claim 1, wherein the lower-k dielectric material comprises nonpolar or weak polar groups.

6. The dielectric composition of claim 1, wherein the lower-k dielectric material is a polystyrene, polysiloxane, polysilsesquioxane, polyphenylene, poly(1,3-butadiene), poly(α-vinylnaphthalene), polypropylene, polyisoprene, polyisobutylene, polyethylene, poly(4-methyl-1-pentene), poly(p-xylene), poly(cyclohexyl methacrylate), poly (propylmethacrylPOSS-co-methylmethacrylate), poly(propylmethacrylPOSS-co-styrene), poly(styrylPOSS-co-styrene), or poly(vinyl cinnamate).

7. The dielectric composition of claim 1, wherein the lower-k dielectric material is poly(methyl silsesquioxane).

8. The dielectric composition of claim 1, wherein the higher-k dielectric material comprises polar groups.

9. The dielectric composition of claim 1, wherein the higher-k dielectric material is a polyimide, polyester, polyether, polyacrylate, polyvinyl, polyketone, polysulfone, poly (4-vinyl phenol) (PVP), poly(vinyl alcohol), poly(2-hydroxylethyl methacrylate) (PHEMA), cyanoethylated poly (vinyl alcohol), cyanoethylated cellulose, poly(vinylidene fluoride) (PVDF), poly(vinyl pyridine), or copolymer thereof.

10. The dielectric composition of claim 1, wherein the higher-k dielectric material is poly(4-vinyl phenol) or poly (2-hydroxylethyl methacrylate).

11. The dielectric composition of claim 1, wherein the difference in magnitude of the dielectric constant of the higher-k dielectric material versus the lower-k dielectric material is at least about 0.5.

12. The dielectric composition of claim 1, wherein the liquid comprises water, an alcohol, an acetate, a ketone, an ether, a hydrocarbon, an aromatic hydrocarbon, a chlorinated solvent, dimethyl sulfoxide, trifluoroacetic acid, acetonitrile, dimethyl formamide, dimethyl acetamide, pyridine, or n-methyl-alpha-pyrrolidinone.

13. The dielectric composition of claim 1, wherein the concentration of the lower-k dielectric material is from about 0.5 to about 50 percent by weight, and the concentration of the higher-k dielectric material is from about 0.5 to about 50 percent by weight, based on the total weight of the lower-k dielectric material, the higher-k dielectric material, and the liquid.

14. The dielectric composition of claim 1, wherein the weight ratio of the lower-k dielectric material to the higher-k dielectric material is from about 10:90 to about 40:60.

15. The dielectric composition of claim 1, further comprising a crosslinking agent for the lower-k dielectric material or the higher-k dielectric material.

16. The dielectric composition of claim 1, further comprising inorganic nanoparticles.

17. A dielectric composition comprising:
   a lower-k polysilsesquioxane dielectric material;
   a higher-k dielectric material selected from poly(4-vinyl phenol) and poly(2-hydroxylethyl methacrylate); and
   a liquid in which both the lower-k dielectric material and the higher-k dielectric material are miscible.

18. The dielectric composition of claim 17, wherein the liquid is an alcohol.

19. The dielectric composition of claim 17, wherein the weight ratio of the lower-k dielectric material to the higher-k dielectric material is from about 10:90 to about 40:60.

\* \* \* \* \*

UNITED STATES PATENT AND TRADEMARK OFFICE
CERTIFICATE OF CORRECTION

PATENT NO. : 7,829,625 B2
APPLICATION NO. : 12/436975
DATED : November 9, 2010
INVENTOR(S) : Yiliang Wu et al.

Page 1 of 1

It is certified that error appears in the above-identified patent and that said Letters Patent is hereby corrected as shown below:

In the Specification:

Column 1, line 24, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*